United States Patent [19]
Van De Burgt

[11] Patent Number: 5,426,651
[45] Date of Patent: Jun. 20, 1995

[54] METHOD FOR THE AUTOMATIC GENERATION OF TEST SEQUENCES

[75] Inventor: Stephanus P. Van De Burgt, Utrecht, Netherlands

[73] Assignee: Koninklijke PTT Nederland N.V., The Hague, Netherlands

[21] Appl. No.: 78,429

[22] Filed: Jun. 16, 1993

[30] Foreign Application Priority Data

Jul. 2, 1992 [NL] Netherlands ............... 9201182

[51] Int. Cl.⁶ ..................................... G06F 11/00
[52] U.S. Cl. ............................ 371/27; 371/15.1; 371/22.1
[58] Field of Search ............. 371/27, 15.1, 22.1, 371/22.2, 24, 27

[56] References Cited

U.S. PATENT DOCUMENTS

| | | |
|---|---|---|
| 4,692,921 | 9/1987 | Dahbura et al. |
| 4,764,863 | 8/1988 | Silverthorn, III et al. ......... 364/200 |
| 4,829,575 | 5/1989 | Lloyd ............................. 381/41 |
| 4,991,176 | 2/1991 | Dahbura et al. |
| 5,239,262 | 8/1993 | Grutzner et al. ............... 371/22.5 |

OTHER PUBLICATIONS

F. Lombardi 'On a New Approach for Enhancing the Fault Coverage of Conformance Testing of Protocol' IEEE 1991 pp. 428–435.

Shen et al 'Protocol Conformance Testing Using Multiple UIO Sequenies' IEEE 1992 pp. 1282–1287.

P. R. Menon 'FSM-Based Test Generation Methods-A Survey' IEEE 1992 pp. 196–200.

Hasan Ural, "Formal Methods for Test Sequence Generation", pp. 311–325, Computer Communications vol. 15, No. 5, Jun. 1992, London, GB.

*Primary Examiner*—Robert W. Beausoliel, Jr.
*Assistant Examiner*—Albert Decady
*Attorney, Agent, or Firm*—Frishauf, Holtz, Goodman & Woodward

[57] ABSTRACT

Method for the automatic generation, from a system or protocol specified as an FSM, of unique test sequences in order to establish whether or not the implementation is in a particular state. On the basis of the FSM a table comprising legal possibilities is generated for each state, as well as a series of tables comprising legal impossibilities for the remaining states. Unique test sequences are found by selecting those IO sequences which occur in the "possibilities table" and in all the "impossibilities tables". If required, the shortest UIO sequence can be selected therefrom.

5 Claims, 2 Drawing Sheets

METHOD FOR THE AUTOMATIC GENERATION OF TEST SEQUENCES

BACKGROUND OF THE INVENTION

The invention relates to a method for the automatic generation, from a system or protocol specified as an FSM, of sequences of input signals, which are to be supplied to a system to be tested, together with the associated output signals which are to be received from the system to be tested and which serve to establish whether or not the implementation is in a particular state.

A useful introduction to the problems addressed by the present invention is provided in the U.S. Pat. No. 4,692,921 of AT&T, where it is stated that there has always been a need for the functioning of electronic systems to be tested and verified against the intended functioning. In the past, tests intended for this purpose were devised by the system designers who, in doing so, depended on their knowledge of the system design and the likely behaviour thereof. As VLSI (Very Large Scale Integration) progressed, this became more difficult. One of the causes is that there are no internal test points which can be approached to isolate faults. Another reason is that, in general, there are no repair possibilities. A further reason is that the design philosophy has changed from designs which attempt to limit the number of transistors to designs which intend to reduce the "real estate" and the input/output complexity.

The number of active elements in an integrated circuit (IC) amounts to hundreds of thousands, and is still increasing. The masks with which these ICs are produced are very expensive and it is therefore extremely important that the ICs fabricated therewith function according to their specifications. Another point is that during fabrication no defects must be introduced, such as active elements which stick on the value 1 or 0. Even more importantly, it must be possible for ICs containing such defects to be detected quickly and simply.

Hereinbelow, as in the said U.S. Patent, use will be made of the possibility to describe digital systems as "finite state machines" (FSM) which, in response to certain sequences of input signals, emit certain sequences of output signals. These are called finite state machines because, in contrast to analog systems, they can adopt only a limited number of internal states and jump from one state to another state ("state transition" or "edge") in response to one or more input signals. An FSM can therefore also be regarded as having been specified by its reaction to input signals (in the form of output signals). An FSM can be represented both in the form of a diagram and in the form of tables.

Said U.S. Patent discloses a method for developing test sequences for evaluating the design or the functioning of a digital system presented as an FSM. According to the method disclosed, the entire FSM is run through, and all the state transitions are tested. For each state transition, a test is developed which comprises a three-part test sequence. The first part is a sequence which puts the FSM into a first state. The second part, by supplying an input signal, causes a state transition from the first state to a second state. The third part is formed by a sequence which is unique for the second state and whose purpose is to check whether the implemented FSM has indeed reached the state desired (in accordance with the specified FSM). This part is therefore formed by a sequence of input signals together with the associated output signals, which is unique with respect to all the other states of the FSM and can serve as a "signature", as it were, for that state. The invention is in the field of the automatic generation, from a system or protocol specified as an FSM, of sequences of input signals, which are to be supplied to a system to be tested, together with the associated output signals which are to be received from the system to be tested and which serve to establish whether or not the implementation is in a particular state, in other words the generation of unique input/output sequences (UIO sequences), and is comparable to process step 1 in the said patent.

According to the known method for generating this type of sequences, the UIO sequences are generated via three intermediate steps. In the first intermediate step, a table is generated containing the "labels" of all state transitions and a designation of the "head" and the "tail" state(s) of each of those labels. In the second intermediate step, all the state transitions having a "null" input are identified, as well as all the state transitions whose tail state is identical to a head state of a state transition having a null input. Consecutive state transitions of this type then form a "meta" state transition. The meta state transitions and the remaining (non-null input) state transitions are incorporated in a second table. As a third step, this table is sorted according to state transition labels, and the labels which occur only once are marked. The labels are then sorted according to head state. The marked labels are unique. Finally, in a fourth step, the third step is repeated a number of times, resulting, generally, in a unique UIO sequence.

Generating UIO sequences in this manner have a number of drawbacks. Notably, the known method results in only one UIO sequence for a particular state. Furthermore, when carrying out the said fourth step of the known method, there is the risk that this ends up in an "infinite loop", namely if no UIO sequence can be found.

The method according to the present invention, in contrast, generates all the UIO sequences which are possible for a particular state (from which, incidentally, the shortest is preferably selected).

SUMMARY OF THE INVENTION

The invention therefore relates to a method for the automatic generation, from a system or protocol specified as an FSM, of sequences of input signals, which are to be supplied to a system to be tested, together with the associated output signals which are to be received from the system to be tested and which serve to establish whether or not the implementation is in a particular state. The invention is characterised by a first step in which the FSM is converted into a first table containing input-output signals and associated start and end states;
  a second step in which, for a particular state, a second table is generated by copying the first table and, in doing so, marking that state as a start state and all the other states as a valid end state;
  a third step in which for each of the other states a third table is generated by copying the first or the second table, adding thereto at least one escape state and, in those third tables, in each case marking that other state as a start state and that escape state as a valid end state for all invalid input-output signals;

a fourth step in which a fourth table is generated by logically combining the second table with all the third tables to give combination states which occur both in the second and in all the third tables, that combination state being marked as a start state which is marked as a start state in both the second and in all the third tables, and all those combination states being marked as an end state which are marked as an end state in both the second and in all the third tables;

a fifth step in which each sequence of input-output signals from the fourth table, starting from a combination state marked as a start state and ending in a combination state marked as an end state, is selected as one of the desired test sequences and is stored in a fifth table.

To put it more simply, the method according to the invention successively comprises a conversion of the FSM—stored, for example, in a computer file—into a "base table" from which, for example for each state, two types of tables are generated. First—for that state—a table is produced in which, starting from that state as a start state, all the (according to the FSM) legal end states which are possible from that start state are indicated; this table could be called "possibilities table". This table thus comprises all the legal IO sequences which are possible from that start state. Thereafter—or at the same time—a table is produced for all the other states, in which table, starting from that "other" state as a start state, all nonlegal IO sequences are registered. A "virtual" end state for those nonlegal IO sequences is introduced in the form of an "escape state". In other words, if a nonlegal IO sequence is supplied in a particular state, the system always ends up in such an escape state. Thus one table has now been generated for the initial state, comprising legal IO sequences from that state, the "possibilities table" and a series of tables—'-'impossibilities tables"—comprising all nonlegal IO sequences from the other states. In order to establish that a system at a given time is in a particular state, it is sufficient to establish that an IO sequence from that state is legal, whereas that IO sequence from all the other states is nonlegal and results in an escape state. In that case, therefore, a UIO sequence is involved. All the UIO sequences for a particular state can thus be found by, starting from that state, logically combining its "possibilities table" with the "impossibilities tables" of all the other states; these sequences therefore must occur in the "possibilities table" AND in all those "impossibilities tables". The IO sequences satisfying this condition are UIO sequences for that state to be tested.

The above method can be carried out for only one state, for example the start state of the FSM, or—successively or simultaneously—for more or even all the states. The method can then preferably be carried out simultaneously for all states, in which case in the second step a second table is generated for all states by copying the first table and, in doing so, marking those various states as a start state in the various second tables, and all the other states as a valid end state;

in the third step a third table is generated for all the states by copying the first or the second table, adding thereto at least one escape state and in each case marking those various states as a start state in those various third tables and that escape state as a valid end state for all invalid input-output signals;

a fourth step in which a fourth table is generated by logically combining the second tables with the third tables as indicated, resulting in combination states which occur both in the second and in all the third tables, those combination states being marked as a start state which are marked as a start state in both the second and in the third tables, and all those combination states being marked as an end state which are marked as an end state in both the second and in the third tables;

a fifth step in which the sequences of input-output signals which start with a combination state marked as a start state and end in a combination state marked as an end state are selected as a desired test sequence and are stored in the fifth table.

By calculating the UIO sequences for all the states simultaneously, the method can thus work very efficiently. To put it simply, in doing so, a "possibilities table" is generated for all states as well as an "impossibilities table" for all states. Subsequently, for each state, the "possibilities table" of that state is logically combined with the "impossibilities tables" of the remaining states, resulting in UIO sequences for each state, by means of which those states can therefore be identified.

ILLUSTRATIVE EMBODIMENTS

Figure 1:
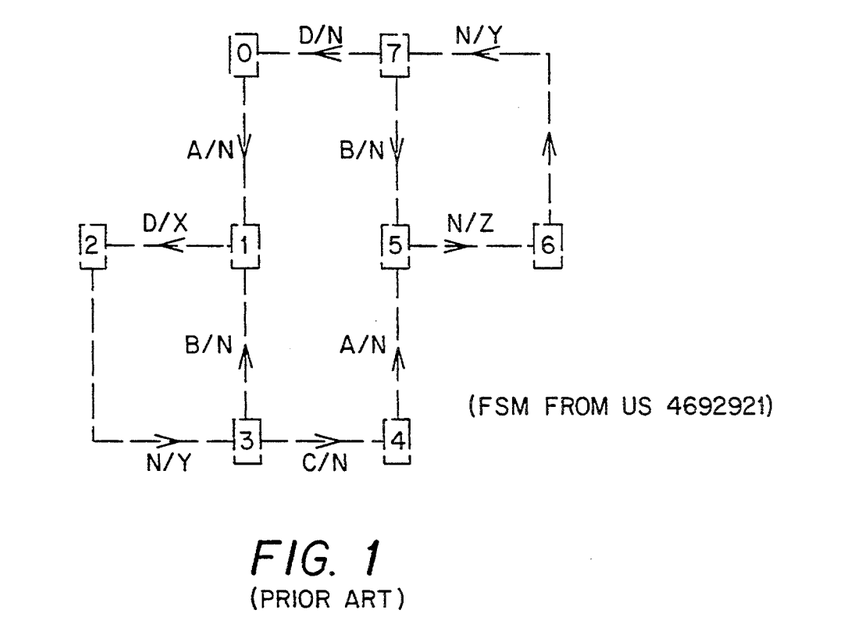
FIG. 1 depicts a state diagram of a finite state machine.
Figure 3:
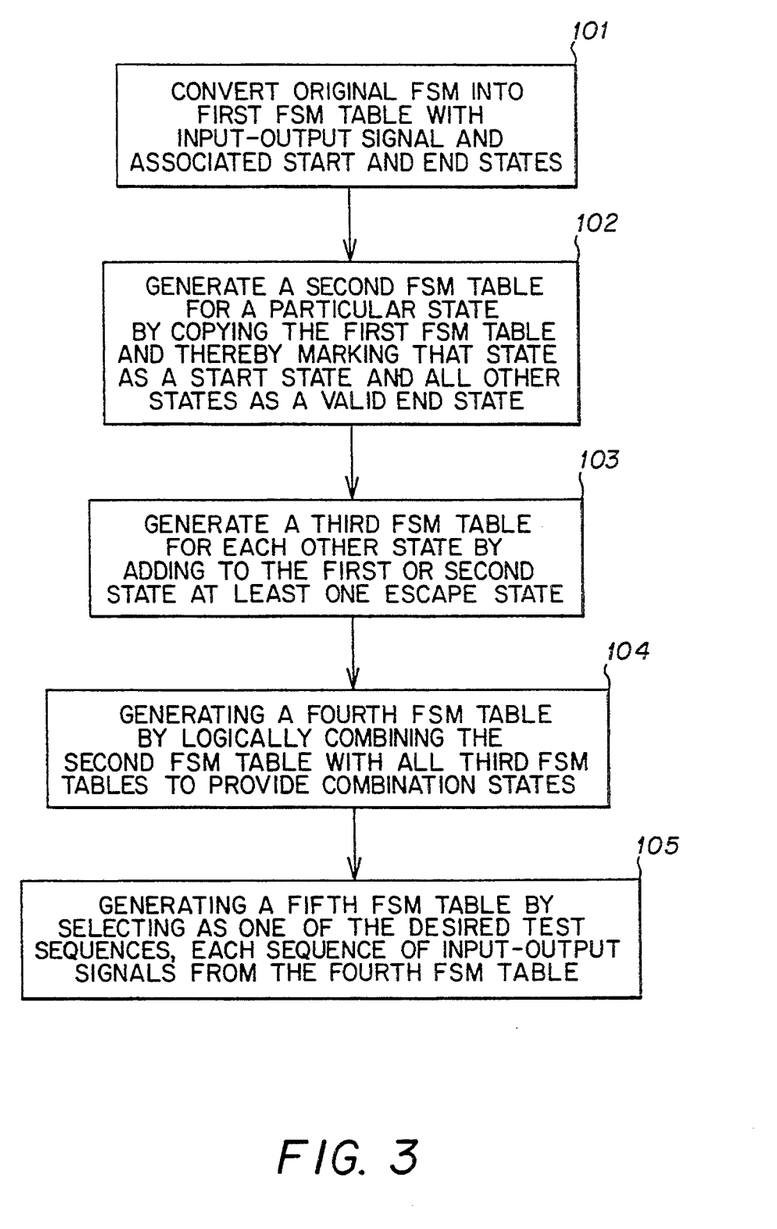
FIG. 3 presents a flow chart describing the method of the invention for developing test sequences.

An example will be given below of the generation of the UIO sequences for state 0 in the FSM of FIG. 1, the same FSM as is shown in U.S. Pat. No. 4,692,921. In doing so, the steps will be followed which are specified in the main claim. These steps are illustrated in FIG. 3.

I. In the first step 101, the FSM is converted into a first table containing input-output signals and start and end states associated therewith; see TABLE 1.

II. In the second step 102, a second table is generated for a particular initial state—in this case state 0—by copying the first table and, in doing so, marking that state as a start state, and all the other states as valid end states; see TABLE 2.

III. In the third step 103, a third table is generated for each state other than the initial state by copying the first or the second table, adding thereto an escape state, and in each case marking, in those third tables, that other state as a start state and that escape state as a valid end state for all invalid input-output signals (hereinafter, a,b,c, . . . indicate the various escape states); see TABLE 3.

IV. In the fourth step 104, a fourth table is generated by logically combining (' ') the second table (the "possibilities table") see TABLE 2, with all the third tables (the "impossibilities tables") see TABLE 3 to give combination states which occur both in the second and in all the third tables, that combination state being marked as a start state which is marked in both the third table and in all the third tables as a start state, and all those combination states being marked as an end state which are marked as an end state both in the second table and in all the third tables.

First of all, the generation of the logical combination (' ') of all "impossibilities tables" of the states≠state 0 is demonstrated; see TABLE 4.

Then the "possibilities table" of state 0 is logically combined with the "impossibilities tables" of the states≠0; see TABLE 5.

V. In the fifth step 105, the sequences of input-output signals which start with a combination state marked as a start state ('S') and which end in a combination state marked as an end state ('E') are selected as one of the desired test sequences and are stored in a fifth table.

This works as follows (see TABLE 5):

Starting from the start state, it is ascertained which "paths" lead to an end state. The following sequences are produced:

01234567S(1) —> A/N —> 1abc5efg(2) —> D/X —> 2abcdefg(3) End state
01234567s(1) —> A/N —> 1abc5efg(2) —> D/X —> 2abcdefg(3) —> N/Y —>3abcdefg(4) End state
01234567S(1) —> A/N —> 1abc5efg(2) —> D/X —> 2abcdefg(3) —> N/Y —> 3abcdefg(4) —> R/N —> 0abcdefg(5) End state
01234567S(1) —> A/N —> 1abc5efg(2) —> D/X —> 2abcdefg(3) —> N/Y —> 3abcdefg(4) —> R/N —> 0abcdefg(5) —> A/N —> 1abcdefg(6) End state
Etcetera The UIO sequences are therefore A/N → D/X
A/N → D/X → N/Y
A/N → D/X → N/Y → R/N
A/N → D/X → N/Y → R/N → A/N
Etcetera As all the sequences start with the same sequence A/N→D/X, the remaining sequences in fact do not add anything. The only relevant UIO sequence is therefore the UIO sequence A/N→D/X, which is suitable as a "signature" for state 0.

In the same way, UIO sequences can be generated for the other FSM states, such as for state 7; see TABLE 6.

Two (independent) IO sequences are produced from this system, which can both be used as a UIO sequence, viz.

D/N (which effects the transition from state (1) to (2));

B/N→N/Z (which successively effects the transition from state (3) to (4) and then from (4) to (5)).

Figure 2:
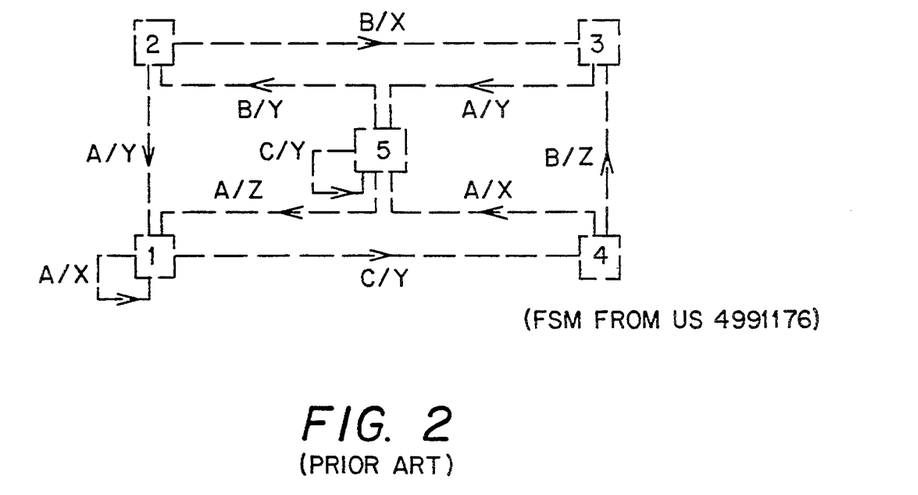
FIG. 2 depicts another state diagram of a finite state machine.

Finally, the elaboration is also given for an FSM which is shown in FIG. 2 and which is taken from U.S. Pat. No. 4,991,176 (AT&T), specifically for the state of that FSM 1; see TABLE 7. The result was obtained in the same manner as described hereinabove, in this case even as many as five UIO sequences:

(A/X A/X)
(A/X C/Y A/X)
(A/X C/Y B/Z)
(C/Y A/X)
(C/Y B/Z)

According to Dijkstra's known shortest-path method, it can be calculated that (A/X A/X) is the shortest of these UIO sequences.

For the sake of completeness, TABLE 8 shows the source code of the computer program with which the method according to the invention can be carried out, which program was also used to produce the above illustrative examples.

REFERENCES

U.S. Pat. No. 4,692,921 (AT&T)

The following applies in the tables below:
Start state: S
End state: E
'Possibilities table' for the state n: M[n]
'Impossibilities tabel' for the state m: compl(M[m])

TABLE 1

|     | M    |     |     |     |     |     |     |     |
| --- | ---- | --- | --- | --- | --- | --- | --- | --- |
|     | A/N  | R/N | D/X | N/Y | B/N | C/N | N/Z | D/N |
| 0SE | 1    | 0   | —   | —   | —   | —   | —   | —   |
| 1E  | —    | 0   | 2   | —   | —   | —   | —   | —   |
| 2E  | —    | 0   | —   | 3   | —   | —   | —   | —   |
| 3E  | —    | 0   | —   | —   | 1   | 4   | —   | —   |
| 4E  | 5    | 0   | —   | —   | —   | —   | —   | —   |
| 5E  | —    | 0   | —   | —   | —   | —   | 6   | —   |
| 6E  | —    | 0   | —   | 7   | —   | —   | —   | —   |
| 7E  | —    | 0   | —   | —   | 5   | —   | —   | 0   |

TABLE 2

|     | M[0] |     |     |     |     |     |     |     |
| --- | ---- | --- | --- | --- | --- | --- | --- | --- |
|     | A/N  | R/N | D/X | N/Y | B/N | C/N | N/Z | D/N |
| 0SE | 1    | 0   | —   | —   | —   | —   | —   | —   |
| 1E  | —    | 0   | 2   | —   | —   | —   | —   | —   |
| 2E  | —    | 0   | —   | 3   | —   | —   | —   | —   |
| 3E  | —    | 0   | —   | —   | 1   | 4   | —   | —   |
| 4E  | 5    | 0   | —   | —   | —   | —   | —   | —   |
| 5E  | —    | 0   | —   | —   | —   | —   | 6   | —   |
| 6E  | —    | 0   | —   | 7   | —   | —   | —   | —   |
| 7E  | —    | 0   | —   | —   | 5   | —   | —   | 0   |

TABLE 3

|     | A/N | R/N | D/X | N/Y | B/N | C/N | N/Z | D/N |
| --- | --- | --- | --- | --- | --- | --- | --- | --- |
|     | compl(M[1]) | | | | | | | |
| aE  | a   | a   | a   | a   | a   | a   | a   | a   |
| 0   | 1   | 0   | a   | a   | a   | a   | a   | a   |
| 1S  | a   | 0   | 2   | a   | a   | a   | a   | a   |
| 2   | a   | 0   | a   | 3   | a   | a   | a   | a   |
| 3   | a   | 0   | a   | a   | 1   | 4   | a   | a   |
| 4   | 5   | 0   | a   | a   | a   | a   | a   | a   |
| 5   | a   | 0   | a   | a   | a   | a   | 6   | a   |
| 6   | a   | 0   | a   | 7   | a   | a   | a   | a   |
| 7   | a   | 0   | a   | a   | 5   | a   | a   | 0   |
|     | compl(M[2]) | | | | | | | |
| bE  | b   | b   | b   | b   | b   | b   | b   | b   |
| 0   | 1   | 0   | b   | b   | b   | b   | b   | b   |
| 1   | b   | 0   | 2   | b   | b   | b   | b   | b   |
| 2S  | b   | 0   | b   | 3   | b   | b   | b   | b   |
| 3   | b   | 0   | b   | b   | 1   | 4   | b   | b   |
| 4   | 5   | 0   | b   | b   | b   | b   | b   | b   |
| 5   | b   | 0   | b   | b   | b   | b   | 6   | b   |
| 6   | b   | 0   | b   | 7   | b   | b   | b   | b   |
| 7   | b   | 0   | b   | b   | 5   | b   | b   | 0   |
|     | compl(M[3]) | | | | | | | |
| cE  | c   | c   | c   | c   | c   | c   | c   | c   |
| 0   | 1   | 0   | c   | c   | c   | c   | c   | c   |
| 1   | c   | 0   | 2   | c   | c   | c   | c   | c   |
| 2   | c   | 0   | c   | 3   | c   | c   | c   | c   |
| 3S  | c   | 0   | c   | c   | 1   | 4   | c   | c   |
| 4   | 5   | 0   | c   | c   | c   | c   | c   | c   |
| 5   | c   | 0   | c   | c   | c   | c   | 6   | c   |
| 6   | c   | 0   | c   | 7   | c   | c   | c   | c   |
| 7   | c   | 0   | c   | c   | 5   | c   | c   | 0   |
|     | compl(M[4]) | | | | | | | |
| dE  | d   | d   | d   | d   | d   | d   | d   | d   |
| 0   | 1   | 0   | d   | d   | d   | d   | d   | d   |
| 1   | d   | 0   | 2   | d   | d   | d   | d   | d   |
| 2   | d   | 0   | d   | 3   | d   | d   | d   | d   |
| 3   | d   | 0   | d   | d   | 1   | 4   | d   | d   |
| 4S  | 5   | 0   | d   | d   | d   | d   | d   | d   |

TABLE 3-continued

| | A/N | R/N | D/X | N/Y | B/N | C/N | N/Z | D/N |
|---|---|---|---|---|---|---|---|---|
| 5 | d | 0 | d | d | d | d | 6 | d |
| 6 | d | 0 | d | 7 | d | d | d | d |
| 7 | d | 0 | d | d | 5 | d | d | 0 |
| compl(M[5]) | | | | | | | | |
| eE | e | e | e | e | e | e | e | e |
| 0 | 1 | 0 | e | e | e | e | e | e |
| 1 | e | 0 | 2 | e | e | e | e | e |
| 2 | e | 0 | e | 3 | e | e | e | e |
| 3 | e | 0 | e | e | 1 | 4 | e | e |
| 4 | 5 | 0 | e | e | e | e | e | e |
| 5S | e | 0 | e | e | e | e | 6 | e |
| 6 | e | 0 | e | 7 | e | e | e | e |
| 7 | e | 0 | e | e | 5 | e | e | 0 |
| compl(M[6]) | | | | | | | | |
| fE | f | f | f | f | f | f | f | f |
| 0 | 1 | 0 | f | f | f | f | f | f |
| 1 | f | 0 | 2 | f | f | f | f | f |
| 2 | f | 0 | f | 3 | f | f | f | f |
| 3 | f | 0 | f | f | 1 | 4 | f | f |
| 4 | 5 | 0 | f | f | f | f | f | f |
| 5 | f | 0 | f | f | f | f | 6 | f |
| 6S | f | 0 | f | 7 | f | f | f | f |
| 7 | f | 0 | f | f | 5 | f | f | 0 |
| compl(M[7]) | | | | | | | | |
| gE | 9 | 9 | 9 | 9 | 9 | 9 | 9 | 9 |
| 0 | 1 | 0 | g | g | g | g | g | g |
| 1 | g | 0 | 2 | g | g | g | g | g |
| 2 | g | 0 | g | 3 | g | g | g | g |
| 3 | g | 0 | g | 9 | 1 | 4 | g | g |
| 4 | 5 | 0 | g | g | g | 9 | 9 | 9 |
| 5 | 9 | 0 | g | g | 9 | 9 | 6 | g |
| 6 | 9 | 0 | g | 7 | 9 | 9 | 9 | 9 |
| 7S | 9 | 0 | g | g | 5 | g | g | 0 |

TABLE 4

| | A/N | R/N | D/X | N/Y | B/N | C/N | N/Z | D/N |
|---|---|---|---|---|---|---|---|---|
| compl(M[1]) v compl(M[2]) | | | | | | | | |
| 12S | ab | 00 | 2b | a3 | ab | ab | ab | ab |
| abE | ab | ab | ab | ab | ab | ab | ab | ab |
| a3 | ab | a0 | ab | ab | a1 | a4 | ab | ab |
| 2b | ab | 0b | ab | 3b | ab | ab | ab | ab |
| 00 | 11 | 00 | ab | ab | ab | ab | ab | ab |
| a4 | a5 | a0 | ab | ab | ab | ab | ab | ab |
| a1 | ab | a0 | a2 | ab | ab | ab | ab | ab |
| a0 | a1 | a0 | ab | ab | ab | ab | ab | ab |
| 3b | ab | 0b | ab | ab | 1b | 4b | ab | ab |
| 0b | 1b | 0b | ab | ab | ab | ab | ab | ab |
| 11 | ab | 00 | 22 | ab | ab | ab | ab | ab |
| a5 | ab | a0 | ab | ab | ab | ab | a6 | ab |
| a2 | ab | a0 | ab | a3 | ab | ab | ab | ab |
| 1b | ab | 0b | 2b | ab | ab | ab | ab | ab |
| 4b | 5b | 0b | ab | ab | ab | ab | ab | ab |
| 22 | ab | 00 | ab | 33 | ab | ab | ab | ab |
| a6 | ab | a0 | ab | a7 | ab | ab | ab | ab |
| 5b | ab | 0b | ab | ab | ab | ab | 6b | ab |
| 33 | ab | 00 | ab | ab | 11 | 44 | ab | ab |
| a7 | ab | a0 | ab | ab | a5 | ab | ab | a0 |
| 6b | ab | 0b | ab | 7b | ab | ab | ab | ab |
| 44 | 55 | 00 | ab | ab | ab | ab | ab | ab |
| 7b | ab | 0b | ab | ab | 5b | ab | ab | 0b |
| 55 | ab | 00 | ab | ab | ab | ab | 66 | ab |
| 66 | ab | 00 | ab | 77 | ab | ab | ab | ab |
| 77 | ab | 00 | ab | ab | 55 | ab | ab | 00 |
| compl(M[1]) v compl(M[2]) v compl(M[3]) | | | | | | | | |
| 123S | abc | 000 | 2bc | a3c | ab1 | ab4 | abc | abc |
| abcE | abc | abc | abc | abc | abc | abc | abc | abc |
| ab4 | ab5 | ab0 | abc | abc | abc | abc | abc | abc |
| ab1 | abc | ab0 | ab2 | abc | abc | abc | abc | abc |
| a3c | abc | a0c | abc | abc | a1c | a4c | abc | abc |
| 2bc | abc | 0bc | abc | 3bc | abc | abc | abc | abc |
| 000 | 111 | 000 | abc | abc | abc | abc | abc | abc |
| ab0 | ab1 | ab0 | abc | abc | abc | abc | abc | abc |
| ab5 | abc | ab0 | abc | abc | abc | abc | ab6 | abc |
| ab2 | abc | ab0 | abc | ab3 | abc | abc | abc | abc |
| a4c | a5c | a0c | abc | abc | abc | abc | abc | abc |
| a1c | abc | a0c | a2c | abc | abc | abc | abc | abc |
| a0c | a1c | a0c | abc | abc | abc | abc | abc | abc |
| 3bc | abc | 0bc | abc | abc | 1bc | 4bc | abc | abc |
| 0bc | 1bc | 0bc | abc | abc | abc | abc | abc | abc |
| 111 | abc | 000 | 222 | abc | abc | abc | abc | abc |
| ab6 | abc | ab0 | abc | ab7 | abc | abc | abc | abc |
| ab3 | abc | ab0 | abc | abc | ab1 | ab4 | abc | abc |
| a5c | abc | a0c | abc | abc | abc | abc | a6c | abc |
| a2c | abc | a0c | abc | a3c | abc | abc | abc | abc |
| 1bc | abc | 0bc | 2bc | abc | abc | abc | abc | abc |
| 4bc | 5bc | 0bc | abc | abc | abc | abc | abc | abc |
| 222 | abc | 000 | abc | 333 | abc | abc | abc | abc |
| ab7 | abc | ab0 | abc | abc | ab5 | abc | abc | ab0 |
| a6c | abc | a0c | abc | a7c | abc | abc | abc | abc |
| 5bc | abc | 0bc | abc | abc | abc | abc | 6bc | abc |
| 333 | abc | 000 | abc | abc | 111 | 444 | abc | abc |
| a7c | abc | a0c | abc | abc | a5c | abc | abc | a0c |
| 6bc | abc | 0bc | abc | 7bc | abc | abc | abc | abc |
| 444 | 555 | 000 | abc | abc | abc | abc | abc | abc |
| 7bc | abc | 0bc | abc | abc | 5bc | abc | abc | 0bc |

TABLE 4-continued

|       | A/N   | R/N   | D/X   | N/Y   | B/N   | C/N   | N/Z   | D/N   |
|-------|-------|-------|-------|-------|-------|-------|-------|-------|
| 555   | abc   | 000   | abc   | abc   | abc   | abc   | 666   | abc   |
| 666   | abc   | 000   | abc   | 777   | abc   | abc   | abc   | abc   |
| 777   | abc   | 000   | abc   | abc   | 555   | abc   | abc   | 000   | compl(M[1]) v compl(M[2]) v compl(M[3]) v compl(M[4])

|         | A/N   | R/N   | D/X   | N/Y   | B/N   | C/N   | N/Z   | D/N   |
|---------|-------|-------|-------|-------|-------|-------|-------|-------|
| 1234S   | abc5  | 0000  | 2bcd  | a3cd  | ab1d  | ab4d  | abcd  | abcd  |
| abcdE   | abcd  | abcd  | abcd  | abcd  | abcd  | abcd  | abcd  | abcd  |
| ab4d    | ab5d  | ab0d  | abcd  | abcd  | abcd  | abcd  | abcd  | abcd  |
| ab1d    | abcd  | ab0d  | ab2d  | abcd  | abcd  | abcd  | abcd  | abcd  |
| a3cd    | abcd  | a0cd  | abcd  | abcd  | a1cd  | a4cd  | abcd  | abcd  |
| abc5    | abcd  | abc0  | abcd  | abcd  | abcd  | abcd  | abc6  | abcd  |
| 2bcd    | abcd  | 0bcd  | abcd  | 3bcd  | abcd  | abcd  | abcd  | abcd  |
| 0000    | 1111  | 0000  | abcd  | abcd  | abcd  | abcd  | abcd  | abcd  |
| ab0d    | ab1d  | ab0d  | abcd  | abcd  | abcd  | abcd  | abcd  | abcd  |
| ab5d    | abcd  | ab0d  | abcd  | abcd  | abcd  | abcd  | ab6d  | abcd  |
| ab2d    | abcd  | ab0d  | abcd  | ab3d  | abcd  | abcd  | abcd  | abcd  |
| a4cd    | a5cd  | a0cd  | abcd  | abcd  | abcd  | abcd  | abcd  | abcd  |
| a1cd    | abcd  | a0cd  | a2cd  | abcd  | abcd  | abcd  | abcd  | abcd  |
| a0cd    | a1cd  | a0cd  | abcd  | abcd  | abcd  | abcd  | abcd  | abcd  |
| abc6    | abcd  | abc0  | abcd  | abc7  | abcd  | abcd  | abcd  | abcd  |
| abc0    | abc1  | abc0  | abcd  | abcd  | abcd  | abcd  | abcd  | abcd  |
| 3bcd    | abcd  | 0bcd  | abcd  | abcd  | 1bcd  | 4bcd  | abcd  | abcd  |
| 0bcd    | 1bcd  | 0bcd  | abcd  | abcd  | abcd  | abcd  | abcd  | abcd  |
| 1111    | abcd  | 0000  | 2222  | abcd  | abcd  | abcd  | abcd  | abcd  |
| ab6d    | abcd  | ab0d  | abcd  | ab7d  | abcd  | abcd  | abcd  | abcd  |
| ab3d    | abcd  | ab0d  | abcd  | abcd  | ab1d  | ab4d  | abcd  | abcd  |
| a5cd    | abcd  | a0cd  | abcd  | abcd  | abcd  | abcd  | a6cd  | abcd  |
| a2cd    | abcd  | a0cd  | abcd  | a3cd  | abcd  | abcd  | abcd  | abcd  |
| abc7    | abcd  | abc0  | abcd  | abcd  | abc5  | abcd  | abcd  | abc0  |
| abc1    | abcd  | abc0  | abc2  | abcd  | abcd  | abcd  | abcd  | abcd  |
| 1bcd    | abcd  | 0bcd  | 2bcd  | abcd  | abcd  | abcd  | abcd  | abcd  |
| 4bcd    | 5bcd  | 0bcd  | abcd  | abcd  | abcd  | abcd  | abcd  | abcd  |
| 2222    | abcd  | 0000  | abcd  | 3333  | abcd  | abcd  | abcd  | abcd  |
| ab7d    | abcd  | ab0d  | abcd  | abcd  | ab5d  | abcd  | abcd  | ab0d  |
| a6cd    | abcd  | a0cd  | abcd  | a7cd  | abcd  | abcd  | abcd  | abcd  |
| abc2    | abcd  | abc0  | abcd  | abc3  | abcd  | abcd  | abcd  | abcd  |
| 5bcd    | abcd  | 0bcd  | abcd  | abcd  | abcd  | abcd  | 6bcd  | abcd  |
| 3333    | abcd  | 0000  | abcd  | abcd  | 1111  | 4444  | abcd  | abcd  |
| a7cd    | abcd  | a0cd  | abcd  | abcd  | a5cd  | abcd  | abcd  | a0cd  |
| abc3    | abcd  | abc0  | abcd  | abcd  | abc1  | abc4  | abcd  | abcd  |
| 6bcd    | abcd  | 0bcd  | abcd  | 7bcd  | abcd  | abcd  | abcd  | abcd  |
| 4444    | 5555  | 0000  | abcd  | abcd  | abcd  | abcd  | abcd  | abcd  |
| abc4    | abc5  | abc0  | abcd  | abcd  | abcd  | abcd  | abcd  | abcd  |
| 7bcd    | abcd  | 0bcd  | abcd  | abcd  | 5bcd  | abcd  | abcd  | 0bcd  |
| 5555    | abcd  | 0000  | abcd  | abcd  | abcd  | abcd  | 6666  | abcd  |
| 6666    | abcd  | 0000  | abcd  | 7777  | abcd  | abcd  | abcd  | abcd  |
| 7777    | abcd  | 0000  | abcd  | abcd  | 5555  | abcd  | abcd  | 0000  | compl(M[1]) v compl(M[2]) v compl(M[3]) v compl(M[4]) v compl(M[5])

|         | A/N   | R/N   | D/X    | N/Y    | B/N    | C/N    | N/Z    | D/N    |
|---------|-------|-------|--------|--------|--------|--------|--------|--------|
| 12345S  | abc5e | 00000 | 2bcde  | a3cde  | ab1de  | ab4de  | abcd6  | abcde  |
| abcdeE  | abcde | abcde | abcde  | abcde  | abcde  | abcde  | abcde  | abcde  |
| abcd6   | abcde | abcd0 | abcde  | abcd7  | abcde  | abcde  | abcde  | abcde  |
| ab4de   | ab5de | ab0de | abcde  | abcde  | abcde  | abcde  | abcde  | abcde  |
| ab1de   | abcde | ab0de | ab2de  | abcde  | abcde, | abcde  | abcde  | abcde  |
| a3cde   | abcde | a0cde | abcde  | abcde  | a1cde  | a4cde  | abcde  | abcde  |
| abc5e   | abcde | abc0e | abcde  | abcde  | abcde  | abcde  | abc6e  | abcde  |
| 2bcde   | abcde | 0bcde | abcde  | 3bcde  | abcde  | abcde  | abcde  | abcde  |
| 00000   | 11111 | 00000 | abcde  | abcde  | abcde  | abcde  | abcde  | abcde  |
| abcd7   | abcde | abcd0 | abcde  | abcde  | abcd5  | abcde  | abcde  | abcd0  |
| abcd0   | abcd1 | abcd0 | abcde  | abcde  | abcde  | abcde  | abcde  | abcde  |
| ab0de   | ab1de | ab0de | abcde  | abcde  | abcde  | abcde  | abcde  | abcde  |
| ab5de   | abcde | ab0de | abcde  | abcde  | abcde  | abcde  | ab0de  | abcde  |
| ab2de   | abcde | ab0de | abcde  | ab3de  | abcde  | abcde  | abcde  | abcde  |
| a4cde   | a5cde | a0cde | abcde  | abcde  | abcde  | abcde  | abcde  | abcde  |
| a1cde   | abcde | a0cde | a2cde  | abcde  | abcde  | abcde  | abcde  | abcde  |
| a0cde   | a1cde | a0cde | abcde  | abcde  | abcd0  | abcde  | abcde  | abcde  |
| abc6e   | abcde | abc0e | abcde  | abc7e  | abcde  | abcde  | abcde  | abcde  |
| abc0e   | abc1e | abc0e | abcde  | abcde  | abcde  | abcde  | abcde  | abcde  |
| 3bcde   | abcde | 0bcde | abcde  | abcde  | 1bcde  | 4bcde  | abcde  | abcde  |
| 0bcde   | 1bcde | 0bcde | abcde  | abcde  | abcde  | abcde  | abcde  | abcde  |
| 11111   | abcde | 00000 | 22222  | abcde  | abcde  | abcde  | abcde  | abcde  |
| abcd5   | abcde | abcd0 | abcde  | abcde  | abcde  | abcde  | abcd6  | abcde  |
| abcd1   | abcde | abcd0 | abcd2  | abcde  | abcde  | abcde  | abcde  | abcde  |
| ab0de   | abcde | ab0de | abcde  | ab7de  | abcde  | abcde  | abcde  | abcde  |
| ab3de   | abcde | ab0de | abcde  | abcde  | ab1de  | ab4de  | abcde  | abcde  |
| a5cde   | abcde | a0cde | abcde  | abcde  | abcde  | abcde  | a6cde  | abcde  |
| a2cde   | abcde | a0cde | abcde  | a3cde  | abcde  | abcde  | abcde  | abcde  |
| abc7e   | abcde | abc0e | abcde  | abcde  | abc5e  | abcde  | abcde  | abc0e  |
| abc1e   | abcde | abc0e | abc2e  | abcde  | abcde  | abcde  | abcde  | abcde  |
| 1bcde   | abcde | 0bcde | 2bcde  | abcde  | abcde  | abcde  | abcde  | abcde  |
| 4bcde   | 5bcde | 0bcde | abcde  | abcde  | abcde  | abcde  | abcde  | abcde  |
| 22222   | abcde | 00000 | abcde  | 33333  | abcde  | abcde  | abcde  | abcde  |

TABLE 4-continued

|  | A/N | R/N | D/X | N/Y | B/N | C/N | N/Z | D/N |
|---|---|---|---|---|---|---|---|---|
| abcd2 | abcde | abcd0 | abcde | abcd3 | abcde | abcde | abcde | abcde |
| ab7de | abcde | ab0de | abcde | abcde | ab5de | abcde | abcde | ab0de |
| a6cde | abcde | a0cde | abcde | a7cde | abcde | abcde | abcde | abcde |
| abc2e | abcde | abe0e | abcde | abc3e | abcde | abcde | abcde | abcde |
| 5bcde | abcde | 0bcde | abcde | abcde | abcde | abcde | 6bcde | abcde |
| 33333 | abcde | 00000 | abcde | abcde | 11111 | 44444 | abcde | abcde |
| abcd3 | abcde | abcd0 | abcde | abcde | abcd1 | abcd4 | abede | abcde |
| a7cde | abcde | a0,de | abcde | abcd, | a5cde | abcde | abcde | a0cde |
| abc3e | abcde | abc0e | abcde | abcde | abc1e | abc4e | abcde | abcde |
| 6bcde | abcde | 0bcde | abcde | 7bcde | abcde | abcde | abcde | abcde |
| 44444 | 55555 | 00000 | abcde | abcde | abede | abcde | abede | abcde |
| abcd4 | abcd5 | abcd0 | abcde | abcde | abcde | abcde | abcde | abcde |
| abc4e | abc5e | abe0e | abcde | abcde | abede | abcde | abcde | abcde |
| 7bcde | abcde | 0bcde | abcde | abcde | 5bcde | abcde | abcde | 0bcde |
| 55555 | abcde | 00000 | abcde | abcde | abcde | abcde | 66666 | abcde |
| 66666 | abcde | 00000 | abcde | 77777 | abcde | abcde | abcde | abcde |
| 77777 | abede | 00000 | abcde | abcde | 55555 | abcde | abcde | 00000 | compl(M[1]) ∨ compl(M[2]) ∨ compl(M[3]) ∨ compl(M[4]) ∨ compl(M[5])   compl(M[6])

| 123456S | abc5ef | 000000 | 2bcdef | a3cde7 | ab1def | ab4def | abcd6f | abcdef |
| abcdefE | abcdef | abcdef | abcdef | abcdef | abcdef | abcdef | abcdef | abcdef |
| abcd6f | abcdef | abcd0f | abcdef | abcd7f | abcdef | abcdef | abcdef | abcdef |
| ab4def | ab5def | ab0def | abcdef | abcdef | abcdef | abcdef | abcdef | abcdef |
| ab1def | abcdef | ab0def | ab2def | abcdef | abcdef | abcdef | abcdef | abcdef |
| a3cde7 | abcdef | a0cde0 | abcdef | abcdef | a1cde5 | a4cdef | abcdef | abcde0 |
| abc5ef | abcdef | abc0ef | abcdef | abcdef | abcdef | abcdef | abc6ef | abcdef |
| 2bcdef | abcdef | 0bcdef | abedef | 3bcdef | abcdef | abcdef | abcdef | abcdef |
| 000000 | 111111 | 000000 | abcdef | abcdef | abcdef | abcdef | abcdef | abcdef |
| abcd7f | abcdef | abcd0f | abcdef | abcdef | abcd5f | abcdef | abcdef | abcd0f |
| abcd0f | abcd1f | abcd0f | abcdef | abcdef | abcdef | abcdef | abcdef | abcdef |
| ab0def | ab1def | ab0def | abcdef | abcdef | abcdef | abcdef | abcdef | abcdef |
| ab5def | abcdef | ab0def | abcdef | abcdef | abcdef | abcdef | ab6def | abcdef |
| ab2def | abcdef | ab0def | abcdef | ab3def | abcdef | abcdef | abcdef | abcdef |
| abcde0 | abcde1 | abcde0 | abcdef | abcdef | abcdef | abcdef | abcdef | abcdef |
| a4cdef | a5cdef | a0cdef | abcdef | abcdef | abcdef | abcdef | abcdef | abcdef |
| a1cde5 | abcdef | a0cde0 | a2cdef | abcdef | abcdef | abcdef | abcde6 | abcdef |
| a0cde0 | a1cde1 | a0cde0 | abcdef | abcdef | abcdef | abcdef | abcdef | abcdef |
| abc6ef | abcdef | abc0ef | abcdef | abc7ef | abcdef | abcdef | abcdef | abcdef |
| abc0ef | abc1ef | abc0ef | abcdef | abcdef | abcdef | abcdef | abcdef | abcdef |
| 3bcdef | abcdef | 0bcdef | abcdef | abcdef | 1bcdef | 4bcdef | abcdef | abcdef |
| 0bcdef | 1bcdef | 0bcdef | abcdef | abcdef | abcdef | abcdef | abcdef | abcdef |
| 111111 | abcdef | 000000 | 222222 | abcdef | abcdef | abcdef | abcdef | abcdef |
| abcd5f | abcdef | abcd0f | abcdef | abcdef | abcdef | abcdef | abcd6f | abcdef |
| abcd1f | abcdef | abcd0f | abcd2f | abcdef | abcdef | abcdef | abcdef | abcdef |
| ab6def | abcdef | ab0def | abcdef | ab7def | abcdef | abcdef | abcdef | abcdef |
| ab3def | abcdef | ab0def | abcdef | abcdef | ab1def | ab4def | abcdef | abcdef |
| abcde1 | abcdef | abcde0 | abcde2 | abcdef | abcdef | abcdef | abcdef | abedef |
| a0cdef | a1cdef | a0cdef | abcdef | abcdef | abcdef | abcdef | abcdef | abcdef |
| a5cdef | abcdef | a0cdef | abcdef | abcdef | abcdef | abcdef | a6cdef | abcdef |
| abcde6 | abcdef | abcde0 | abcdef | abcde7 | abcdef | abcdef | abcdef | abcdef |
| a2cdef | abcdef | a0cdef | abcdef | a3cdef | abcdef | abcdef | abcdef | abcdef |
| a1cde1 | abcdef | a0cde0 | a2cde2 | abcdef | abcdef | abcdef | abcdef | abcdef |
| abc7ef | abcdef | abc0ef | abcdef | abedef | abc5ef | abcdef | abcdef | abc0ef |
| abc1ef | abcdef | abc0ef | abc2ef | abcdef | abcdef | abcdef | abcdef | abcdef |
| 1bcdef | abcdef | 0bcdef | 2bcdef | abcdef | abcdef | abcdef | abcdef | abcdef |
| 4bcdef | 5bcdef | 0bcdef | abcdef | abcdef | abcdef | abcdef | abcdef | abcdef |
| 222222 | abcdef | 000000 | abcdef | 333333 | abcdef | abcdef | abcdef | abcdef |
| abcd2f | abcdef | abcd0f | abcdef | abcd3f | abedef | abcdef | abcdef | abcdef |
| ab7def | abcdef | ab0def | abcdef | abcdef | ab5def | abcdef | abcdef | ab0def |
| abcde2 | abcdef | abcde0 | abcdef | abcde3 | abcdef | abcdef | abcdef | abcdef |
| a1cdef | abcdef | a0cdef | a2cdef | abcdef | abcdef | abcdef | abcdef | abcdef |
| a6cdef | abcdef | a0cdef | abcdef | a7cdef | abcdef | abcdef | abcdef | abcdef |
| abcde7 | abcdef | abcde0 | abcdef | abcdef | abede5 | abcdef | abcdef | abcde0 |
| a3cdef | abcdef | a0cdef | abcdef | abcdef | a1cdef | a4cdef | abcdef | abcdef |
| a2cde2 | abcdef | a0cde0 | abcdef | a3cde3 | abcdef | abcdef | abcdef | abcdef |
| abc2ef | abcdef | abc0ef | abcdef | abc3ef | abcdef | abcdef | abcdef | abcdef |
| 5bcdef | abcdef | 0bcdef | abcdef | abcdef | abcdef | abcdef | 6bcdef | abcdef |
| 333333 | abcdef | 000000 | abcdef | abcdef | 111111 | 444444 | abcdef | abcdef |
| abcd3f | abcdef | abcd0f | abcdef | abcdef | abcd1f | abcd4f | abcdef | abcdef |
| abcde3 | abcdef | abcde0 | abcdef | abcdef | abcde1 | abcde4 | abcdef | abcdef |
| a7cdef | abcdef | a0cdef | abcdef | abcdef | a5cdef | abcdef | abcdef | a0cdef |
| abcde5 | abcdef | abcde0 | abcdef | abcdef | abcdef | abcdef | abcde6 | abcdef |
| a3cde3 | abcdef | a0cde0 | abcdef | abcdef | a1cde1 | a4cde4 | abcdef | abcdef |
| abc3ef | abcdef | abc0ef | abcdef | abcdef | abc1ef | abc4ef | abcdef | abcdef |
| 6bcdef | abcdef | 0bcdef | abcdef | 7bcdef | abcdef | abcdef | abcdef | abcdef |
| 444444 | 555555 | 000000 | abcdef | abcdef | abcdef | abcdef | abcdef | abcdef |
| abcd4f | abcd5f | abcd0f | abcdef | abcdef | abcdef | abcdef | abcdef | abcdef |
| abcde4 | abcde5 | abcde0 | abcdef | abcdef | abcdef | abcdef | abcdef | abcdef |
| a4cde4 | a5cde5 | a0cde0 | abcdef | abcdef | abcdef | abcdef | abcdef | abcdef |
| abc4ef | abc5ef | abc0ef | abcdef | abcdef | abcdef | abcdef | abcdef | abcdef |
| 7bcdef | abcdef | 0bcdef | abcdef | abcdef | 5bcdef | abcdef | abcdef | 0bcdef |
| 555555 | abcdef | 000000 | abcdef | abcdef | abcdef | abcdef | 666666 | abcdef |

TABLE 4-continued

| | A/N | R/N | D/X | N/Y | B/N | C/N | N/Z | D/N |
|---|---|---|---|---|---|---|---|---|
| a5cde5 | abcdef | a0cde0 | abcdef | abcdef | abcdef | abcdef | a6cde6 | abcdef |
| 666666 | abcdef | 000000 | abcdef | 777777 | abcdef | abcdef | abcdef | abcdef |
| a6cde6 | abcdef | a0cde0 | abcdef | a7cde7 | abcdef | abcdef | abcdef | abcdef |
| 777777 | abcdef | 000000 | abcdef | abcdef | 555555 | abcdef | abcdef | 000000 |
| a7cde7 | abcdef | a0cde0 | abcdef | abcdef | a5cde5 | abcdef | abcdef | a0cde0 | compl(M[1]) v compl(M[2]) v compl(M[3]) v compl(M[4]) v compl(M[5])
  compl(M[6])  compl(M[7])

| 1234567S | abc5efg | 0000000 | 2bcdefg | a3cde7g | ab1def5 | ab4defg | abcd6fg | abcdef0 |
|---|---|---|---|---|---|---|---|---|
| abcdef0 | abcdef1 | abedef0 | abcdefg | abcdefg | abcdefg | abcdefg | abcdefg | abcdefg |
| abcd6fg | abcdefg | abcd0fg | abcdefg | abcd7fg | abcdefg | abcdefg | abcdefg | abcdefg |
| ab4defg | ab5defg | ab0defg | abcdefg | abcdefg | abcdefg | abcdefg | abcdefg | abcdefg |
| ab1def5 | abcdefg | ab0def0 | ab2defg | abcdefg | abcdefg | abcdefg | abcdef6 | abcdefg |
| a3cde7g | abcdefg | a0,de0g | abcdefg | abcdefg | a1cde5g | a4cdefg | abcdefg | abcde0g |
| abc5efg | abcdefg | abc0efg | abcdefg | abcdefg | abcdefg | abcdefg | abc6efg | abcdefg |
| 2bcdefg | abcdefg | 0bcdefg | abcdefg | 3bcdefg | abcdefg | abcdefg | abcdefg | abcdefg |
| 0000000 | 1111111 | 0000000 | abcdefg | abcdefg | abcdefg | abcdefg | abcdefg | abcdefg |
| abcdefgE | abcdefg | abcdefg | abcdefg | abcdefg | abcdefg | abcdefg | abcdefg | abcdefg |
| abedef1 | abcdefg | abedef0 | abcdef2 | abcdefg | abcdefg | ab,defg | abcdefg | abcdefg |
| abcd7fg | abcdefg | abcd0fg | abcdefg | abcdefg | abcd5fg | abcdefg | abcdefg | abcd0fg |
| abcd0fg | abcd1fg | abcd0fg | abcdefg | abcdefg | abcdefg | abcdefg | abcdefg | abcdefg |
| ab0defg | ab1defg | ab0defg | abcdefg | abcdefg | abcdefg | abcdefg | abcdefg | abcdefg |
| ab5defg | abcdef | ab0defg | abcdefg | abcdefg | abcdefg | abcdefg | ab6defg | abcdefg |
| ab,def6 | abcdefg | ab0def0 | abcdefg | abcdef7 | abcdefg | abcdefg | abcdefg | abcdefg |
| ab2defg | abcdefg | ab0defg | abcdefg | ab3defg | abcdefg | abcdefg | abcdefg | abcdefg |
| ab0def0 | ab1def1 | ab0def0 | abcdefg | abcdefg | abcdefg | abcdefg | abcdefg | abedefg |
| abcde0g | abcde1g | abcde0g | abcdefg | abcdefg | abcdefg | abcdefg | abcdefg | abcdefg |
| a4cdefg | a5cdefg | a0cdefg | abcdefg | abcdefg | abcdefg | abcdefg | abcdefg | abcdefg |
| a1cde5g | abcdefg | a0cde0g | a2cdefg | abcdefg | abcdefg | abcdefg | abcde6g | abcdefg |
| a0cde0g | a1cde1g | a0cde0g | abcdefg | abcdefg | abcdefg | abcdefg | abedefg | abcdefg |
| abc6efg | abcdefg | abc0efg | abcdefg | abc7efg | abcdefg | abcdefg | abcdefg | abcdefg |
| abc0efg | abc1efg | abc0efg | abcdefg | abcdefg | abcdefg | abcdefg | abcdefg | abcdefg |
| 3bcdefg | abcdefg | 0bcdefg | abcdefg | abcdefg | 1bcdefg | 4bcdefg | abcdefg | abcdefg |
| 0bcdefg | 1bcdefg | 0bcdefg | abcdefg | abcdefg | abcdefg | abcdefg | abcdefg | abcdefg |
| 1111111 | abcdefg | 0000000 | 2222222 | abcdefg | abcdefg | abedefg | abcdefg | abcdefg |
| abcdef2 | abcdefg | abcdef0 | abcdef3 | abcdefg | abcdefg | abcdefg | abcdefg | abcdefg |
| abcd5fg | abcdefg | abcd0fg | abcdefg | abcdefg | abcdefg | abcdefg | abcd6fg | abcdefg |
| abcd1fg | abcdefg | abcd0fg | abcd2fg | abcdefg | abcdefg | abcdefg | abcdefg | abcdefg |
| ab1defg | abcdefg | ab0defg | ab2defg | abcdefg | abcdefg | abcdefg | abcdefg | abcdefg |
| ab6defg | abcdefg | ab0defg | abcdefg | ab7defg | abcdefg | abcdefg | abcdefg | abcdefg |
| abcdef7 | abcdefg | abcdef0 | abcdefg | abcdefg | abcdef5 | abcdefg | abcdefg | abcdef0 |
| ab3defg | abcdefg | ab0defg | abcdefg | abcdefg | ab1defg | ab4defg | abcdefg | abcdefg |
| ab1def1 | abcdefg | ab0def0 | ab2def2 | abcdefg | abcdefg | abcdefg | abcdefg | abcdefg |
| abcde1g | abcdefg | abcde0g | abcde2g | abcdefg | abcdefg | abcdefg | abcdefg | abcdefg |
| a0cdefg | a1cdefg | a0cdefg | abcdefg | abcdefg | abcdefg | abcdefg | abcdefg | abcdefg |
| a5cdefg | abcdefg | a0cdefg | abcdefg | abcdefg | abcdefg | abcdefg | a6cdefg | abcdefg |
| abcde6g | abcdefg | abcde0g | abcdefg | abcde7g | abcdefg | abcdefg | abcdefg | abcdefg |
| a2,defg | abcdefg | a0cdefg | abcdefg | a3cdefg | abedefg | abcdefg | abcdefg | abcdefg |
| a1cde1g | abcdefg | a0,de0g | a2cde2g | abcdefg | abcdefg | abcdefg | abcdefg | abcdefg |
| abc7efg | abcdefg | abc0efg | abedefg | ab,defg | abc5efg | abcdefg | abcdefg | abc0efg |
| abc1efg | abcdefg | abc0efg | abc2efg | abcdefg | abedefg | abedefg | abcdefg | abedefg |
| 1bcd,fg | abcdefg | 0bcdefg | 2bcdefg | abcdefg | abcdefg | abcdefg | abcdefg | abcdefg |
| 4bcdefg | 5bcd,fg | 0bcdefg | abcdefg | abcdefg | abcdefg | abcdefg | abcdefg | abcdefg |
| 2222222 | abcdefg | 0000000 | abcdefg | 3333333 | abcdefg | abcdefg | abcdefg | abcdefg |
| abcdef3 | abcdefg | abedef0 | abcdefg | abcdefg | abcdef1 | abcdef4 | abcdefg | abcdefg |
| abcd2fg | abcdefg | abcd0fg | abcdefg | abcd3fg | abcdefg | abcdefg | abcdefg | abcdefg |
| ab7defg | abcdefg | ab0defg | abedefg | abcdefg | ab5defg | abcdefg | abcdefg | ab0defg |
| abcdef5 | abcdefg | abcdef0 | abcdefg | abcdefg | abcdefg | abcdefg | abcdefg | abcdef6 |
| ab2d,f2 | abcdefg | ab0def0 | abedefg | ab3def3 | abcdefg | abcdefg | abcdefg | abcdefg |
| abed,2g | abcdefg | abcd,0g | abcdefg | abcde3g | abcdefg | abcdefg | abcdefg | abcdefg |
| a1cdefg | abcdefg | a0cdefg | a2cdefg | abcdefg | abcdefg | abcdefg | abcdefg | abcdefg |
| a6cdefg | abcdefg | a0cdefg | abcdefg | a7cdefg | abcdefg | abcdefg | abcdefg | abcdefg |
| ab,de7g | abcdefg | abede0g | abcdefg | abcdefg | ab,de5g | abcdefg | abcdefg | abcde0g |
| a3cdefg | abcdefg | a0cdefg | abcdefg | abcdefg | a1cdefg | a4cdefg | abcdefg | abcdefg |
| a2cde2g | abcdefg | a0cde0g | abcdefg | a3cde3g | abcdefg | abcdefg | abcdefg | abcdefg |
| abc2efg | abcdefg | abc0efg | abcdefg | abc3efg | abcdefg | abcdefg | abcdefg | abcdefg |
| 5bcdefg | abcdefg | 0bcdefg | abcdefg | abcdefg | abcdefg | abedefg | 6bcdefg | abcdefg |
| 3333333 | abcdefg | 0000000 | abcdefg | abcdefg | 1111111 | 4444444 | abcdefg | abcdefg |
| abcdef4 | abcdef5 | abcdef0 | abcdefg | abcdefg | abcdefg | abcdefg | abcdefg | abcdefg |
| abcd3fg | abcdefg | abcd0fg | abcd1fg | abcdefg | abcdefg | abcd4fg | abcdefg | abcdefg |
| ab3def3 | abcdefg | ab0def0 | abcdefg | abcdefg | ab1def1 | ab4def4 | abcdefg | abcdefg |
| abcde3g | abcdefg | abcde0g | abcdefg | abcdefg | abcde1g | abcde4g | abcdefg | abcdefg |
| a7cdefg | abcdefg | a0cdefg | abcdefg | abcdefg | a5cdefg | abcdefg | abcdefg | a0cdefg |
| abcde5g | abcdefg | abcde0g | abcdefg | abcdefg | abcdefg | abcde6g | abcdefg | abcdefg |
| a3cde3g | abcdefg | a0cde0g | abcdefg | abcdefg | a1cde1g | a4cde4g | abcdefg | abcdefg |
| abc3efg | abcdefg | abc0efg | abcdefg | abcdefg | abc1efg | abc4efg | abcdefg | abcdefg |
| 6bcdefg | abcdefg | 0bcdefg | abcdefg | 7bcdefg | abcdefg | abcdefg | abcdefg | abcdefg |
| 4444444 | 5555555 | 0000000 | abcdefg | abcdefg | abcdefg | abcdefg | abcdefg | abcdefg |
| abcd4fg | abcd5fg | abcd0fg | abcdefg | abcdefg | abcdefg | abcdefg | abcdefg | abcdefg |
| ab4def4 | ab5def5 | ab0def0 | abcdefg | abcdefg | abcdefg | abcdefg | abcdefg | abcdefg |
| abcde4g | abcde5g | abcde0g | abcdefg | abcdefg | abcdefg | abcdefg | abcdefg | abcdefg |
| a4cde4g | a5cde5g | a0cde0g | abcdefg | abcdefg | abcdefg | abcdefg | abcdefg | abcdefg |

TABLE 4-continued

| | A/N | R/N | D/X | N/Y | B/N | C/N | N/Z | D/N |
|---|---|---|---|---|---|---|---|---|
| abc4efg | abc5efg | abc0efg | abcdefg | abcdefg | abcdefg | abcdefg | abcdefg | abcdefg |
| 7bcdefg | abedefg | 0bcdefg | abcdefg | abcdefg | 5bcdefg | abcdefg | abcdefg | 0bcdefg |
| 5555555 | abcdefg | 0000000 | abcdefg | abcdefg | abcdefg | abcdefg | 6666666 | abcdefg |
| ab5def5 | abcdefg | ab0def0 | abcdefg | abcdefg | abcdefg | abcdefg | ab6def6 | abcdefg |
| a5cde5g | abcdefg | a0cde0g | abcdefg | abcdefg | abcdefg | abcdefg | a6cde6g | abcdefg |
| 6666666 | abcdefg | 0000000 | abcdefg | 7777777 | abcdefg | abcdefg | abcdefg | abcdefg |
| ab6def6 | ab,defg | ab0def0 | abcdefg | ab7def7 | abedefg | abcdefg | abcdefg | abcdefg |
| a6ede6g | abcdefg | a0cde0g | abcdefg | a7cde7g | abcdefg | abcdefg | abcdefg | abcdefg |
| 7777777 | abcdefg | 0000000 | abcdefg | abcdefg | 5555555 | abcdefg | abcdefg | 0000000 |
| ab7def7 | abcdefg | ab0def0 | abcdefg | abcdefg | ab5def5 | abcdefg | abcdefg | ab0def0 |
| a7cde7g | abcdefg | a0cde0g | abcdefg | abcdefg | a5cde5g | abcdefg | abcdefg | a0cde0g |

TABLE 5

M[0] v compl(M[1]) v compl(M[2]) v compl(M[3]) v compl(M[4]) v compl(M[5]) v compl(M[6]) v compl(M[7]) = UIO(0)

| A/N | R/N | D/X | N/Y | B/N | C/N | N/Z | D/N |
|---|---|---|---|---|---|---|---|
| 01234567S(1) | 1abc5efg(2) | 00000000 | -------- | -------- | -------- | -------- | -------- |
| 1abc5efg | -------- | 0abc0efg | 2abcdefg(3) | -------- | -------- | -------- | -------- |
| 00000000 | 11111111 | 00000000 | -------- | -------- | -------- | -------- | -------- |
| 2abcdefgE | -------- | 0abcdefg | -------- | 3abcdefg(4) | -------- | -------- | -------- |
| 0abc0efg | 1abc1efg | 0abc0efg | -------- | -------- | -------- | -------- | -------- |
| 11111111 | -------- | 00000000 | 22222222 | -------- | -------- | -------- | -------- |
| 3abcdefgE | -------- | 0abcdefg(5) | -------- | -------- | 1abcdefg | 4abcdefg | -------- | -------- |
| 0abcdefgE | 1abcdefg(6) | 0abcdefg | -------- | -------- | -------- | -------- | -------- |
| 1abc1efg | -------- | 0abc0efg | 2abc2efg | -------- | -------- | -------- | -------- |
| 22222222 | -------- | 00000000 | -------- | 33333333 | -------- | -------- | -------- |
| 1abcdefgE | -------- | 0abcdefg | 2abcdefg | -------- | -------- | -------- | -------- |
| 4abcdefgE | 5abcdefg | 0abcdefg | -------- | -------- | -------- | -------- | -------- |
| 2abc2efg | -------- | 0abc0efg | -------- | 3abc3efg | -------- | -------- | -------- |
| 33333333 | -------- | 00000000 | -------- | -------- | 11111111 | 44444444 | -------- | -------- |
| 5abcdefgE | -------- | 0abcdefg | -------- | -------- | -------- | -------- | 6abcdefg | -------- |
| 3abc3efg | -------- | 0abc0efg | -------- | -------- | 1abc1efg | 4abc4efg | -------- | -------- |
| 44444444 | 55555555 | 00000000 | -------- | -------- | -------- | -------- | -------- |
| 6abcdefgE | -------- | 0abcdefg | -------- | 7abcdefg | -------- | -------- | -------- |
| 4abc4efg | 5abc5efg | 0abc0efg | -------- | -------- | -------- | -------- | -------- |
| 55555555 | -------- | 00000000 | -------- | -------- | -------- | 66666666 | -------- |
| 7abcdefgE | -------- | 0abcdefg | -------- | -------- | 5abcdefg | -------- | -------- | 0abcdefg |
| 5abc5efg | -------- | 0abc0efg | -------- | -------- | -------- | -------- | 6abc6efg | -------- |
| 66666666 | -------- | 00000000 | -------- | 77777777 | -------- | -------- | -------- |
| 6abc6efg | -------- | 0abc0efg | -------- | 7abc7efg | -------- | -------- | -------- |
| 77777777 | -------- | 00000000 | -------- | -------- | 55555555 | -------- | -------- | 00000000 |
| 7abc7efg | -------- | 0abc0efg | -------- | -------- | 5abc5efg | -------- | -------- | 0abc0efg |

TABLE 6

M[7] compl(M[0]) compl(M[1]) compl(M[2]) compl(M[2]) compl(M[3]) compl(M[4]) compl(M[5]) compl(M[6]) = UIO(7)

| A/N | R/N | D/X | N/Y | B/N | C/N | N/Z | D/N |
|---|---|---|---|---|---|---|---|
| 76543210S(1) | -------- | 00000000 | -------- | -------- | 5abc1efg(3) | -------- | -------- | 0abcdefg(2) |
| 5abc1efg(4) | -------- | 0abc0efg | -------- | -------- | 6abcdefg(5) | -------- | -------- | -------- |
| 0abcdefgE | 1abcdefg | 0abcdefg | -------- | -------- | -------- | -------- | -------- |
| 00000000 | 11111111 | 00000000 | -------- | -------- | -------- | -------- | -------- |
| 6abcdefgE | -------- | 0abcdefg | -------- | 7abcdefg | -------- | -------- | -------- |
| 0abc0efg | 1abc1efg | 0abc0efg | -------- | -------- | -------- | -------- | -------- |
| 1abcdefgE | -------- | 0abcdefg | 2abcdefg | -------- | -------- | -------- | -------- |
| 11111111 | -------- | 00000000 | 22222222 | -------- | -------- | -------- | -------- |
| 7abcdefgE | -------- | 0abcdefg | -------- | -------- | 5abcdefg | -------- | -------- | 0abcdefg |
| 1abc1efg | -------- | 0abc0efg | 2abc2efg | -------- | -------- | -------- | -------- |
| 2abcdefgE | -------- | 0abcdefg | -------- | 3abcdefg | -------- | -------- | -------- |
| 22222222 | -------- | 00000000 | -------- | 33333333 | -------- | -------- | -------- |
| 5abcdefgE | -------- | 0abcdefg | -------- | -------- | -------- | -------- | 6abcdefg | -------- |
| 2abc2efg | -------- | 0abc0efg | -------- | 3abc3efg | -------- | -------- | -------- |
| 3abcdefgE | -------- | 0abcdefg | -------- | -------- | 1abcdefg | 4abcdefg | -------- | -------- |
| 33333333 | -------- | 00000000 | -------- | -------- | 11111111 | 44444444 | -------- | -------- |
| 3abc3efg | -------- | 0abc0efg | -------- | -------- | 1abc1efg | 4abc4efg | -------- | -------- |
| 4abcdefgE | 5abcdefg | 0abcdefg | -------- | -------- | -------- | -------- | -------- |
| 44444444 | 55555555 | 00000000 | -------- | -------- | -------- | -------- | -------- |
| 4abc4efg | 5abc5efg | 0abc0efg | -------- | -------- | -------- | -------- | -------- |
| 55555555 | -------- | 00000000 | -------- | -------- | -------- | 66666666 | -------- |
| 5abc5efg | -------- | 0abc0efg | -------- | -------- | -------- | -------- | 6abc6efg | -------- |
| 66666666 | -------- | 00000000 | -------- | 77777777 | -------- | -------- | -------- |
| 6abc6efg | -------- | 0abc0efg | -------- | 7abc7efg | -------- | -------- | -------- |
| 77777777 | -------- | 00000000 | -------- | -------- | 55555555 | -------- | -------- | 00000000 |

TABLE 6-continued

M[7] v compl(M[0]) v compl(M[1]) v compl(M[2]) v compl(M[2]) v compl(M[3]) v compl(M[4]) v compl(M[5]) v compl(M[6]) = UIO(7)

| | A/N | R/N | D/X | N/Y | B/N | C/N | N/Z | D/N |
|---|---|---|---|---|---|---|---|---|
| | 7abc7efg | -------- | 0abc0efg | -------- | -------- | 5abc5efg | -------- | -------- | 0abc0efg |

TABLE 7

| | A/X | A/Y | A/Z | B/X | B/Y | B/Z | C/Y |
|---|---|---|---|---|---|---|---|
| | | | | M[1] = M | | | |
| 1S | 1 | — | — | — | — | — | 4 |
| 2E | — | 1 | — | 3 | — | — | — |
| 3E | — | 5 | — | — | — | — | — |
| 4E | 5 | — | — | — | — | 3 | — |
| 5E | — | — | 1 | — | 2 | — | 5 |
| compl(M[2]) | | | | | | | |
| aE | a | a | a | a | a | a | a |
| 1 | 1 | a | a | a | a | a | 4 |
| 2S | a | 1 | 1 | 3 | a | a | a |
| 3 | a | 5 | a | 1 | a | a | a |
| 4 | 5 | a | a | a | a | 3 | a |
| 5 | a | a | 1 | a | 2 | a | 5 |
| compl(M[3]) | | | | | | | |
| bE | b | b | b | b | b | b | b |
| 1 | 1 | b | b | b | b | b | 4 |
| 2 | b | 1 | b | 3 | b | b | b |
| 3S | b | 5 | b | b | b | b | b |
| 4 | 5 | b | b | b | b | 3 | b |
| 5 | b | b | 1 | b | 2 | b | 5 |
| compl(M[4]) | | | | | | | |
| cE | c | c | c | c | c | c | c |
| 1 | 1 | c | c | c | c | c | 4 |
| 2 | c | 1 | c | 3 | c | c | c |
| 3 | c | 5 | c | c | c | c | c |
| 4S | 5 | c | c | c | c | 3 | c |
| 5 | c | c | 1 | c | 2 | c | 5 |
| compl(M[5]) | | | | | | | |
| dE | d | d | d | d | d | d | d |
| 1 | 1 | d | d | d | d | d | 4 |
| 2 | d | 1 | d | 3 | d | d | d |
| 3 | d | 5 | d | d | d | d | d |
| 4 | 5 | d | d | d | d | 3 | d |
| 5S | d | d | 1 | d | 2 | d | 5 |
| compl(M[2]) | compl(M[3]) | | | | | | |
| 23S | ab | 15 | ab | 3b | ab | ab | ab |
| abE | ab | ab | ab | ab | ab | ab | ab |
| 15 | 1b | ab | a1 | ab | a2 | ab | 45 |
| 3b | ab | 5b | ab | ab | ab | ab | ab |
| a2 | ab | a1 | ab | a3 | ab | ab | ab |
| a1 | a1 | ab | ab | ab | ab | ab | a4 |
| 1b | 1b | ab | ab | ab | ab | ab | 4b |
| 45 | 5b | ab | a1 | ab | a2 | 3b | a5 |
| 5b | ab | ab | 1b | ab | 2b | ab | 5b |
| a3 | ab | a5 | ab | ab | ab | ab | ab |
| a4 | a5 | ab | ab | ab | ab | a3 | ab |
| 4b | 5b | ab | ab | ab | ab | 3b | ab |
| a5 | ab | ab | a1 | ab | a2 | ab | a5 |
| 2b | ab | 1b | ab | 3b | ab | ab | ab |
| compl(M[2]) | compl(M[3]) | compl(M[4]) | | | | | |
| 234S | ab5 | 15c | abc | 3bc | abc | ab3 | abc |
| abcE | abc | abc | abc | abc | abc | abc | abc |
| ab3 | abc | ab5 | abc | abc | abc | abc | abc |
| ab5 | abc | abc | ab1 | abc | ab2 | abc | ab5 |
| 15c | 1bc | abc | a1c | abc | a2c | abc | 45c |
| 3bc | abc | 5bc | abc | abc | abc | abc | abc |
| ab2 | abc | ab1 | abc | ab3 | abc | abc | abc |
| ab1 | ab1 | abc | abc | abc | abc | abc | ab4 |
| a2c | abc | a1c | abc | a3c | abc | abc | abc |
| a1c | a1c | abc | abc | abc | abc | abc | a4c |
| 1bc | 1bc | abc | abc | abc | abc | abc | 4bc |
| 45c | 5bc | abc | a1c | abc | a2c | 3bc | a5c |
| 5bc | abc | abc | 1bc | abc | 2bc | abc | 5bc |
| ab4 | ab5 | abc | abc | abc | abc | ab3 | abc |
| a3c | abc | a5c | abc | abc | abc | abc | abc |
| a4c | a5c | abc | abc | abc | abc | a3c | abc |
| 4bc | 5bc | abc | abc | abc | abc | 3bc | abc |
| a5c | abc | abc | a1c | abc | a2c | abc | a5c |
| 2bc | abc | 1bc | abc | 3bc | abc | abc | abc |
| compl(M[2]) | compl(M[3]) | compl(M[4]) | compl(M[5]) | | | | |

TABLE 7-continued

| | A/X | A/Y | A/Z | B/X | B/Y | B/Z | C/Y |
|---|---|---|---|---|---|---|---|
| 2345S | ab5d | 15cd | abc1 | 3bcd | abc2 | ab3d | abc5 |
| abc5 | abcd | abcd | abc1 | abcd | abc2 | abcd | abc5 |
| ab3d | abcd | ab5d | abcd | abcd | abcd | abcd | abcd |
| abc2 | abcd | abc1 | abcd | abcs | abcd | abcd | abcd |
| abc1 | abc1 | abcd | abcd | abcd | abcd | abcd | abc4 |
| ab5d | abcd | abcd | ab1d | abcd | ab2d | abcd | ab5d |
| 15cd | 1bcd | abcd | a1cd | abcd | a2cd | abcd | 45cd |
| 3bcd | abcd | 5bcd | abcd | abcd | abcd | abcd | abcd |
| abcdE | abcd | abcd | abcd | abcd | abcd | abcd | abcd |
| abcs | abcd | abc5 | abcd | abcd | abcd | abcd | abcd |
| abc4 | abc5 | abcd | abcd | abcd | abcd | abcs | abcd |
| ab2d | abcd | ab1d | abcd | ab3d | abcd | abcd | abcd |
| ab1d | ab1d | abcd | abcd | abcd | abcd | abcd | ab4d |
| a2cd | abcd | a1cd | abcd | a3cd | abcd | abcd | abcd |
| a1cd | a1cd | abcd | abcd | abcd | abcd | abcd | a4cd |
| 1bcd | 1bcd | abcd | abcd | abcd | abcd | abcd | 4bcd |
| 45cd | 5bcd | abcd | a1cd | abcd | a2cd | 3bcd | a5cd |
| 5bcd | abcd | abcd | 1bcd | abcd | 2bcd | abcd | 5bcd |
| ab4d | ab5d | abcd | abcd | abcd | abcd | ab3d | abcd |
| a3cd | abcd | a5cd | abcd | abcd | abcd | abcd | abcd |
| a4cd | a5cd | abcd | abcd | abcd | abcd | a3cd | abcd |
| 4bcd | 5bcd | abcd | abcd | abcd | abcd | 3bcd | abcd |
| a5cd | abcd | abcd | a1cd | abcd | a2cd | abcd | a5cd |
| 2bcd | abcd | 1bcd | abcd | 3bcd | abcd | abcd | abcd |
| M[1] | compl(M(8 2]) | compl(M[3]) | compl(M[4]) | compl(M[5]) | | = UIO[1] | |
| 12345 | 1ab5d | — | — | — | — | — | 4abc5 |
| 1ab5d | 1abcd | — | — | — | — | — | 4ab5d |
| abc5 | 5abcd | — | — | — | — | 3abcd | — |
| 1abcdE | 1abcd | — | — | — | — | — | 4abcd |
| ab5d | 5abcd | — | — | — | — | 3abcd | — |
| abcdE | — | — | 1abcd | — | 2abcd | — | 5abcd |
| abcdE | — | 5abcd | — | — | — | — | — |
| abcdE | 5abcd | — | — | — | — | 3abcd | — |
| abcdE | — | 1abcd | — | 3abcd | — | — | — |

TABLE 8

```
;THE SIGNATURE (UIO, SIOS) ALGORIRITHM
;S.P. van de Burget
;(c) 1990-1992 PTT Research
;P.0 Box 421, Leidschendam
;the Netherlands
;Functions of interest
;(signature FA S)      competes the signature FA of an FA
;(shortest-path FA)    computes a shortest path from start to some end state
;(collect-paths FA)    computes all non-cyclic shortest paths to some end state
;(print-list L)   prints a list, one item per line
;(print-fa FA)    pretty prints the FA
;(restart-fa FA S)     computes a FA with a new start state S
;(isect-ff FAL FA2)    computes the intersection of two FAs
;(compl-fa FA)    compute the complement of an FA
;Examples con be found at the end of this file
(defmacro foreach (var in set where cond &body body)
    '(do ((1st, set (rest 1st)) (,var))
        ((null 1st))
      (setq var (car 1st))
      (con (,cond
            ,@body))))
(defun isect-fa (M1 M2)
    (let ((Q1 (first M1)) (Q2 (first M2)) (Q3 nil)
        A (second M1))
        (d1 (third M1)) (d2 (third M2)) (d3 nil)
        (s1 (fourth M1)) (s2 (fourth M2)) (s3 nil)
        (F1 (fifth M1)) (F2 (fifth M2)) (F3 nil))
    (setq s3 (list s1 s2))
    (setq Q3 (list s3))
    (do ((mark Q3 (rest mark)) (p) (q))
        ((null mark)
        (list Q3 A d3 s3 F3))
      setq p (car (first mark)))
      setq q (cadr (first mark))) ; was cdr, moet second?
      foreach a1 in d1 where (equal (car a1) p) ; of first 7?
        (foreach a2 in d2 where (and (equal (first a2) q
                    (equal (second a2) (second a1)))
            (let* ((ostate (list p q))
                (nstate list (third a1) (third a2)))
                (ntrans (list ostate (second a1) nstate)))
            (cond ((not (member nstate Q3 :test 'equal))
                (setq Q3 (nconc Q3 (list nstate)))))
            (cond ((not (member ntrans d3 :test 'equal))
```

TABLE 8-continued

```
                (setq d3 (nconc d3 (list ntrans)))))
        (cond ((and (member (third a1) F1 ;test 'equal)
                    (member (third a2) F2 :test 'equal)
                    (not (member nstate F3 ;test 'equal)))
               (setq F3 (nconc F3 (list nstate))))))))))
(defun compl-fa (M)
    (let ((Q (first M)) (A (second M)) (d (third M)) (q0 (fourth M))
         (tau (gensym))
         (nQ (first M)) (nd (third M))
         (nF (my-set-diff (first M) (fifth M))))
      (setq nQ (cons tau nQ))
      (setq nF (cons tau nF))
      (foreach a in A where t
          (foreach q in Q where (not (outgoing q a d))
              (setq nd (cons (list q a tau) nd)))
          (setq nd (cons (list tau a tau) nd)))
      (list nQ A nd q0 nF)))
(defun outgoing (q a delta)
  (cond
      ((null delta) nil)
      ((and (equal (caar delta) q) (equal (cadar delta) a)) (caddar delta)) ; t
      (t (outgoing q a (rest delta)))))
(defun restart-fa (M q)
  (cond
(Is continuated)
      ((member q (first M) ;test 'equal)
       (list (first M) (second M) (third M) q (fifth M)))))
(defun signature (M q)
    (do ((qq (my-set-diff (first M) (list q))
             (rest qq))
            (restart-fa M q)))
        ((null qq) nM)
      (setq nM (isect-fa nM (compl-fa (restart-fa M (first qq)))))))
;find a shortest path from start state to some end state
(defun shortest-path (M)
    (reverse (do-shortest (third M) (list (list (fourth M))) (fifth M))))
(defun do-shortest (arcs paths final)
    (let ((newpaths nil) (found nil))
      (foreach p in paths where t
          (foreach a in arcs where (equal (first a) (first p))
              (setq newpaths
                   (cons (cons (third a) (cons (second a) (rest p)))
                        newpaths))
              (cond
                  ((member (third a) final :test 'equal)
                   (setq found (cons (second a) (rest p)))))))
      (cond
          ((not found) (do-shortest arcs newpaths final))
          (t found))))
;collect all non-cyclic shortest path
(defun collect-paths (M)
    (reverse (do-collect M (fourth M) nil nil)))
(defun do-collect (M a visited rseq)
    (let ((uio-a nil))
      (foreach a in (third M) where (equal (first a) s)
          (cond
              ((member (third a) visited)
               t)
(Is continuated)
              ((member (third a) (fifth M) :test 'equal)
               (setq uio-s (cons (reverse (cons (second a) rseq)) uio-s)))
              (t
                (setq uio-s
                    (append (do-collect M (third a)
                          (con s visited)
                          (cons (second a) rseq))
                        uio-s)))))
      uio-s))
(defun print-list (1)
    (foreach e in 1 where t
        (princ e)
        (terpri))
    t)
(defun print-fa (M)
    (terpri)
(foreach a in (second M) where t
        (princ '|    |) (princ a))
    (terpri)
    (foreach s in (first M) where t
        (print-dotted s)
          (print-marker M s)
            (foreach a in (second M) where t
```

TABLE 8-continued

```
            (princ '|     |)
            (print-dotted (nil-to-dash (outgoing s a (third M)))))
        (terpri)) t)
(defun print-marker (M s)
    (cond
        ((equal s (fourth M))
            (cond
                ((member a (fifth M) :test 'equal) (princ '|*|))
                (t (princ '|   |))))
        ((member s (fifth M) :test 'equal) (princ '|#|))
(Is continuated)
(defun print-dotted (L)
    (cond
        ((null L))
        ((atom L) (princ L) (princ '|.|))
        ((listp L) (print-dotted (car L)) (print-dotted (cdr L)))))
(defun nil-to-dash (C)
    (cond
        ((null C) '|-|)
        (t C)))
; Common lisp functions, uncomment if needed
(defun my-set-diff (P Q)
    (set-difference P Q :test 'equal))
;  (cond
;    ((null P) nil)
;    ((member (first Q) P :test 'equal) (my-set-diff (rest P) Q))
;    (t (cons P (my-set-diff (rest P) Q)))))
;(defun first (L)
;   (car L))
;(defun second (L)
;   (cadr L))
;(defun third (L)
;   (caddr L))
;(defun fourth (L)
;   (cadddr L))
;(defun fifth (L)
;   (caddddr L))
;Some example machines
;syntax: (States+Alphabet+Transitions+StartState EndState+)
;all fie a marked with + are lists and each element of Transitions
;has syntax: (FromState Input ToState)
(Is continuated)
(setq M1 '((P1 P2 P3) (A B C)
            ((P1 A P2) (P2 B P2) (P2 C P3)) P1 (P3))) ; ab*c
(setq M2 '((P1 P2 P3) (A B C)
            ((P1 A P2) (P2 B P2) (P2 A P3) (P2 B P3) (P2 C P3)) P1 (P3))) ; ab*.
(setq M3 '((P1 P2 P3) (A B C)
            ((P1 A P2) (P2 C P3)) P1 (P2 P3))) ; a[c]
(setq M4 '((P1 P2 P3 P4) (A B C)
            ((P1 A P2) (P2 C P4) (P2 B P3) (P3 C P4)) P1 (P4))) ; a[b]c
;Paper example
(setq vb '((1 2 3) (a/x a/y b/x b/y)
            ((1 a/x 2) (1 b/y 1) (2 a/y 3) (2 b|y 2) (3 a/x 1) (3 b/x 3))
            1 (1 2 3)))
; pat 4.692.921 example
(setq patl '((0 1 2 3 4 5 6 7) (a/null r/null d/x null/ b/null c/null null/z d/null)
            ((0 a/null 1) (1 d/x 2) (2 null/y 3) (3 b/null 1) (3 c/null 4)
            (4 a/null 5) (5 null/z 6) (6 null/y 7) (7 b/null 5) (7 d/null 0)
            (0 r/null 0) (1 r/null 0) (2 r/null 0) (3 r/null 0) (4 r/null 0)
            (5 r/null 0) (6 r/null 0) (7 r/null 0))
            0 (0 1 2 3 4 5 6 7)))
; pat 4.991.176 example
(setq pat2 '((S1 S2 S3 S4 S5) (a/x a/y a/z b/x b/y b/z c/y)
            ((S1 a/x S1) (S1 c/y S4) (S2 a/y S1) (S2 b/z S3)
            (S3 a/y S5) (S4 a/x S5) (s4 b/z S3)
            (S5 c/y S5) (S5 b/y S2) (S5 a/z S1)
            )
            S1 (S1 S2 S3 S4 S5)))
(princ "the Signature algorithm")(terpri)
(princ "'by Stan van de Burgt")(terpri)
(princ "(c) 1990-1992 PTT Research")(terpri)
T
(Is continuated)
```

I claim:

1. Method for automatic generation, from a system or protocol specified as an FSM, of sequences of input signals, which are to be supplied to a system to be tested, together with associated output signals which are to be received from the system to be tested and which serve to establish whether or not an implementation is in a particular state, comprising steps of:

a first step in which the FSM is converted into a first FSM table containing input-output signals and associated start and end states;

a second step in which, for a particular state, a second FSM table is generated by copying the first FSM table and, in doing so, marking that state as a start state and all other states as a valid end state;

a third step in which for each of the other states a third FSM table is generated by copying the first or the second FSM table, adding thereto at least one escape state and, in those third FSM tables, in each case marking that other state as a start state and that escape state as a valid end state for all invalid input-output signals;

a fourth step in which a fourth FSM table is generated by logically combining the second FSM table with all the third FSM tables to give combination states which occur both in the second and in all the third FSM tables, that combination state being marked as a start state which is marked as a start state in both the second and in all the third FMS tables, and all those combination states being marked as an end state which are marked as an end state in both the second and in all the third FSM tables;

a fifth step in which each sequence of input-output signals from the fourth FSM table, starting from a combination state marked as a start state and ending in a combination state marked as an end state, is selected as one of desired test sequences and is stored in a fifth FSM table.

2. Method according to claim 1, wherein said second and subsequent steps are carried out for only one state of the FSM.

3. Method according to claim 1, wherein said second and subsequent steps are carried out only for the start state of the FSM.

4. Method according to claim 1, wherein said second and subsequent steps are carried out for all states of the FSM.

5. Method according to claim 4, wherein in the second step for all states a second FSM table is generated by copying the first FSM table and, in doing so, marking various states as start states in various second FSM tables, and all other states as a valid end state;

in the third step a third FSM table is generated for all the states by copying the first or the second FSM table, adding thereto at least one escape state and in each case marking those various states as a start state in various third FSM tables and that escape state as a valid end state for all invalid input-output signals;

a fourth step, in which a fourth FSM table is generated by logically combining the second FSM tables with the third FSM tables as indicated, resulting in combination states which occur both in the second and in all the third FSM tables, those combination states being marked as a start state which are marked as a start state in both the second and in the third FSM tables, and all those combination states being marked as an end state which are marked as an end state in both the second and in the third FSM tables;

a fifth step in which the sequences of input-output signals which start with a combination state marked as a start state and end in a combination state marked as an end state are selected as a desired test sequence and are stored in the fifth FSM table.

* * * * *

UNITED STATES PATENT AND TRADEMARK OFFICE
CERTIFICATE OF CORRECTION

PATENT NO. : 5,426,651        page 1 of 3
DATED : June 20, 1995
INVENTOR(S) : Van De Burgt It is certified that error appears in the above-indentified patent and that said Letters Patent is hereby corrected as shown below:

Column 4, under ILLUSTRATIVE EMBODIMENTS, Section IV, lines 55 and 67, change (' ') both occurrences), to --(' ^ ');

Column 8, under "TABLE 3 - continued"

in line which begins with "gE", change "9" to --g-- (all occurrences);

in line which begins with 3, change "9" to --g--;

in line which begins with 5, change "9" to --g-- (all occurrences);

in line which begins with 6, change "9" to --g--; (all occurrences);

in line which begins with 7S, change "9" to --g--.

UNITED STATES PATENT AND TRADEMARK OFFICE
CERTIFICATE OF CORRECTION

PATENT NO. : 5,426,651        page 2 of 3
DATED : June 20, 1995
INVENTOR(S) : Van De Burgt It is certified that error appears in the above-indentified patent and that said Letters Patent is hereby corrected as shown below:

Column 13, under TABLE 4 - continued, in line which begins "a3cde7g", change "a0,de0g" to --a0cde0g--;
Also change "abedef1" to --abcdef1--.
   in line which begins "abcdef1",       change "ab,defg" to --abcdefg--;

in line which begins "ab,def6", change "ab,def6" to --abcdef6--.

In TABLES 4 and 5, in the subheadings, change "v" to --^--.

In TABLE 6, in the subheadings, between each subsection, insert "^".

In Table 6 in the subheadings delete the (second occur.) --compl(m[z])--.

UNITED STATES PATENT AND TRADEMARK OFFICE
CERTIFICATE OF CORRECTION

PATENT NO. : 5,426,651  
DATED : June 20, 1995  
INVENTOR(S) : Van De Burgt

It is certified that error appears in the above-indentified patent and that said Letters Patent is hereby corrected as shown below:

In TABLE 6 - CONTINUED, in the subheading, change "v" to --^--.

In TABLE 7, when a subheading has two or more subsections, insert "^" between each adjacent pair of subsections.

In TABLE 8, line 15, which begins with ";Examples", change "con" to --can--.

Signed and Sealed this

Fifth Day of November, 1996

Attest:

BRUCE LEHMAN

*Attesting Officer*  *Commissioner of Patents and Trademarks*